(12) United States Patent
Aquil et al.

(10) Patent No.: US 11,120,863 B2
(45) Date of Patent: Sep. 14, 2021

(54) SYSTEM AND METHOD FOR COMPENSATING FOR SDRAM SIGNAL TIMING DRIFT THROUGH PERIODIC WRITE TRAINING

(71) Applicant: QUALCOMM INCORPORATED, San Diego, CA (US)

(72) Inventors: Farrukh Aquil, San Diego, CA (US); Vaishnav Srinivas, Oceanside, CA (US); Mahalingam Nagarajan, San Diego, CA (US); Yong Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 16/752,442

(22) Filed: Jan. 24, 2020

(65) Prior Publication Data

US 2021/0233579 A1    Jul. 29, 2021

(51) Int. Cl.

| | |
|---|---|
| *G11C 11/4076* | (2006.01) |
| *G11C 7/10* | (2006.01) |
| *G11C 11/409* | (2006.01) |
| *G06F 13/42* | (2006.01) |

(52) U.S. Cl.
CPC ...... *G11C 11/4076* (2013.01); *G06F 13/4243* (2013.01); *G11C 7/1066* (2013.01); *G11C 11/409* (2013.01)

(58) Field of Classification Search
CPC .. G11C 11/4076; G11C 11/409; G11C 7/1066
USPC .............. 365/191, 192, 201, 189.08, 189.01
See application file for complete search history.

(56) References Cited

U.S. PATENT DOCUMENTS

| | | | |
|---|---|---|---|
| 9,646,675 B1 * | 5/2017 | Lee | ..................... G11C 11/4074 |
| 2007/0201545 A1 * | 8/2007 | Zamir | ..................... H04L 25/06 |
| | | | 375/229 |
| 2020/0076652 A1 * | 3/2020 | Shi | ..................... G06F 11/2284 |

\* cited by examiner

*Primary Examiner* — Connie C Yoha
(74) *Attorney, Agent, or Firm* — Withrow & Terranova, PLLC

(57) ABSTRACT

Signal timing drift in a synchronous dynamic random access memory (SDRAM) system may be compensated for by performing write signal timing training using a multi-purpose command (MPC) first-in-first-out (FIFO) write and MPC FIFO read at periodic intervals interspersed with mission-mode SDRAM traffic. The test result samples obtained from the write signal timing training may be analyzed independently of mission-mode SDRAM traffic. The mission-mode timing of the SDRAM data bit signals relative to the SDRAM write clock signal may be adjusted based on the analysis.

30 Claims, 10 Drawing Sheets

SYSTEM AND METHOD FOR COMPENSATING FOR SDRAM SIGNAL TIMING DRIFT THROUGH PERIODIC WRITE TRAINING

BACKGROUND

Field

The present disclosure relates generally to memory devices and, more particularly, to systems and methods for compensating for timing drift between write clock and data signals in a synchronous dynamic random access memory.

Background

A portable computing device (e.g., laptop computer, mobile phone, etc.) may include one or more processors to perform various functions, such as telephony, wireless data access, camera/video functions, etc. A processor may be coupled to a memory in which processor instructions and data may be stored. A type of memory commonly used in portable computing devices is known as double data rate synchronous dynamic random access memory (DDR-SDRAM).

Some types of SDRAM feature unmatched write clock (also referred to as data strobe) and data signal paths to enable high-speed performance and save power. To properly latch write data from the data signal path into the receiver latch on the memory chip, circuitry that generates the write clock signal must be trained so that the write clock signal arrives at the receiver latch properly aligned with the data eye, such as centered in the data eye. Because temperature changes can affect the relative timing between the write clock and data signals, training is performed periodically in the computing device in which the memory chip is included. Various training techniques are known. Generally, the training determines an amount of time delay to apply to the data signals relative to the write clock signal.

SUMMARY

This summary identifies features of some exemplary aspects and is not an exclusive or exhaustive description of the disclosed subject matter. Additional features and aspects are described and will become apparent to persons skilled in the art upon reading the following detailed description and viewing the drawings that form a part thereof.

A method for compensating for signal timing drift in an SDRAM system in accordance with at least one embodiment is disclosed. The method may include performing write signal timing training a plurality of times at periodic intervals interspersed with mission-mode SDRAM traffic to produce a corresponding plurality of test result samples. The write signal timing training may use a multi-purpose command (MPC) first-in-first-out (FIFO) write and MPC FIFO read. The method may further include analyzing the plurality of test result samples independently of mission-mode SDRAM traffic. The method may still further include adjusting the mission-mode timing of the SDRAM data bit signals relative to the SDRAM write clock signal based on the analysis of the test result samples.

An apparatus for compensating for signal timing drift in an SDRAM system in accordance with at least one embodiment is disclosed. The apparatus may include a host coupled to an SDRAM via a link. The host may comprise a processor system. The host may be configured to control the performance of write signal timing training a plurality of times at periodic intervals interspersed with mission-mode SDRAM traffic to produce a corresponding plurality of test result samples. The write signal timing training may use an MPC FIFO write and MPC FIFO read. The host may further be configured to analyze the plurality of test result samples independently of mission-mode SDRAM traffic. The host may still further be configured to adjust the mission-mode timing of the SDRAM data bit signals relative to the SDRAM write clock signal based on the analysis of the test result samples.

Another apparatus for compensating for signal timing drift in an SDRAM system in accordance with at least one embodiment is also disclosed. The apparatus may include means for performing write signal timing training a plurality of times at periodic intervals interspersed with mission-mode SDRAM traffic to produce a corresponding plurality of test result samples. The write signal timing training may use a multi-purpose command (MPC) first-in-first-out (FIFO) write and MPC FIFO read. The apparatus may further include means for analyzing the plurality of test result samples independently of mission-mode SDRAM traffic. The apparatus may still further include means for adjusting the mission-mode timing of the SDRAM data bit signals relative to the SDRAM write clock signal based on the analysis of the test result samples.

Still another apparatus for compensating for signal timing drift in an SDRAM system in accordance with at least one embodiment is disclosed. The apparatus may include a processor and an SDRAM system. The SDRAM system may comprise an SDRAM, a memory controller, and a physical interface (PHY) configured to couple the SDRAM with the memory controller. The processor system may be configured to transmit to the memory controller a plurality of requests to initiate write signal timing training that uses a multi-purpose command (MPC) first-in-first-out (FIFO) write and MPC FIFO read. The plurality of requests may be transmitted at periodic intervals interspersed with mission-mode SDRAM traffic between the SDRAM and the memory controller. Performing the write signal timing training a plurality of times produces a corresponding plurality of test result samples. The processor system may further be configured to receive the plurality of test result samples from the memory controller independently of mission-mode SDRAM traffic between the SDRAM and the memory controller. The processor system may still further be configured to analyze the plurality of test result samples independently of mission-mode SDRAM traffic between the SDRAM and the memory controller. The processor system may yet further be configured to transmit mission-mode timing settings to the PHY based on the processor's analysis of the plurality of test result samples.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
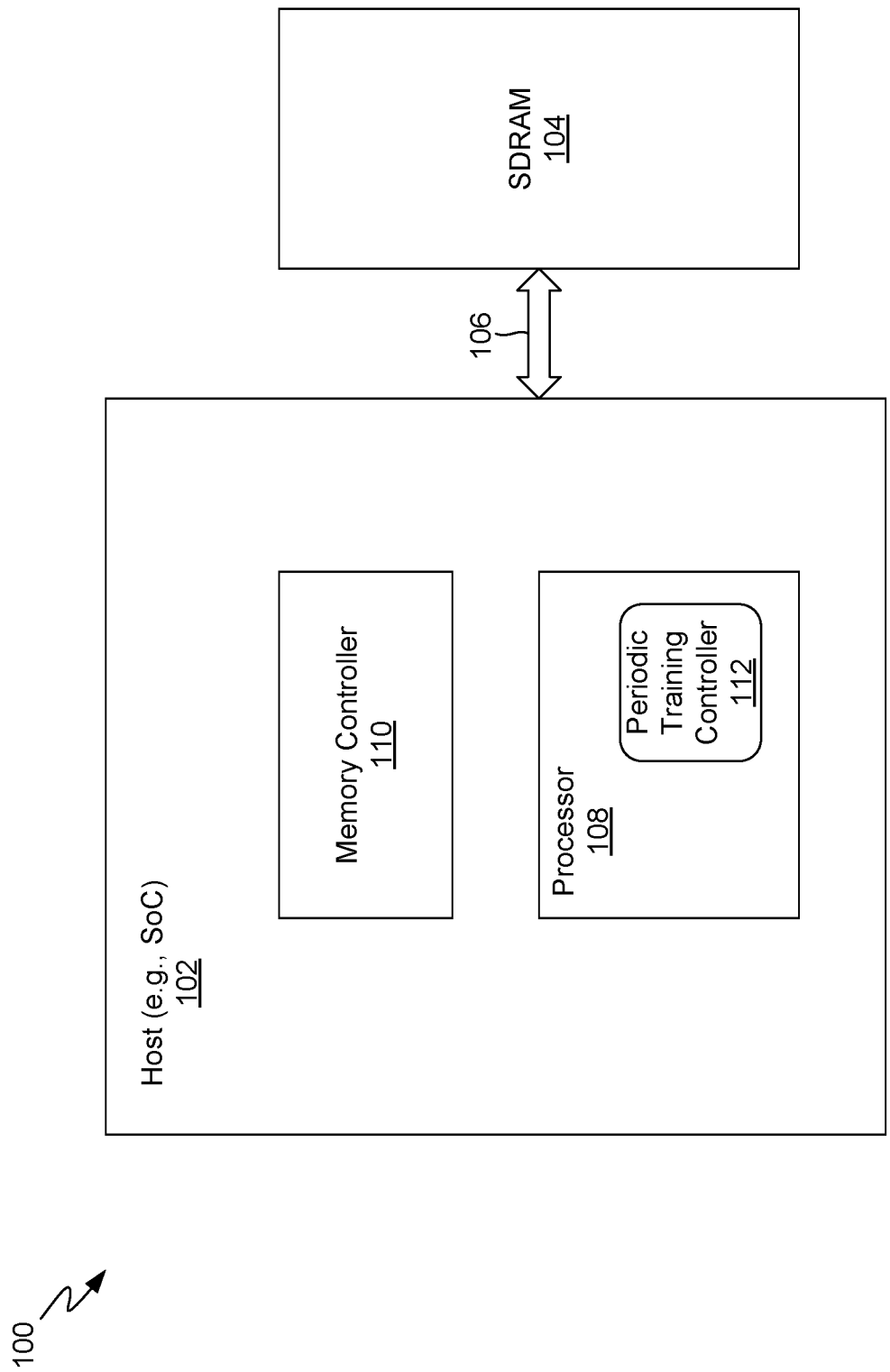
FIG. 1 is a block diagram illustrating an apparatus for compensating for signal timing drift in an SDRAM system, in accordance with certain aspects of the disclosure.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" may mean a transfer of electrical energy between elements A and B, to operate certain intended functions.

In some examples, the term "electrically connected" may mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. may be employed for ease of reference and may not carry substantive meanings. Likewise, names for components/modules may be adopted for ease of reference and might not limit the components/modules. Modules and components presented in the disclosure may be implemented in hardware, software, or a combination of hardware and software. The terms "software" and "firmware" are used synonymously in this disclosure.

The terms "bus system," "interconnect," "interconnect fabric," "link," etc., may provide that elements coupled to such a structure may exchange information therebetween, directly or indirectly. In such fashion, the "bus system" or related structure may encompass multiple physical connections as well as intervening stages such as buffers, latches, registers, etc.

Some commercially available SDRAMs provide a choice of two modes of training that may be used to ensure the write clock (also referred to as a data strobe or "DQS") signal arrives at the receiver latch properly aligned in time with the data ("DQ") eye: (1) an internal DQS clock-tree oscillator, which determines the need for, and the magnitude of, required training; and (2) a command-based write/read method that uses a first-in-first-out (FIFO) buffer in the SDRAM to perform write training with user-defined data patterns.

In the first training method, the rate at which the clock-tree (ring) oscillator toggles is used to determine the DQS-DQ timing. A ring oscillator register may be periodically polled (i.e., at intervals while the SDRAM system is in normal or mission-mode operation), and the value read from the ring oscillator register is used to adjust the DQS-DQ timing. As training using the DQS clock-tree oscillator method may be performed relatively quickly, performing such training at periodic intervals interspersed with mission-mode SDRAM operation does not substantially impact memory latency and thus quality of service.

In the second training method, comparisons between data values written to the FIFO and data values read from the FIFO may be used to adjust the DQS-DQ timing. The SDRAM provides the FIFO so that the data stored in the SDRAM core array need not be disturbed during training. A memory controller, or memory controller in conjunction with an SDRAM physical interface or "PHY," may support a Multi-Purpose Command (MPC). A memory controller may issue an MPC with an operand indicating a FIFO write operation (which may be referred to for brevity herein as an MPC FIFO write). In response, the data value, which may be any selected data value, is written to the FIFO. After writing one or more data values in this manner, the memory controller may issue an MPC with an operating operand indicating a FIFO read operation (which may be referred to for brevity herein as an MPC FIFO read). In response, data is read from the FIFO. After reading one or more data values in this manner, the memory controller may compare the results of reading the FIFO with "expected" data, such as the data values that were written. A mis-match between the results of reading the FIFO and expected data may indicate to the memory controller that the relative timing between the DQ and DQS signals needs to be adjusted. To adjust this timing, the memory controller may transmit configuration settings to the PHY to adjust configurable delay cells (CDCs) in the PHY.

In a conventional MPC FIFO write/read training method, the above-described steps may be repeated for a number of iterations, with the DQ delay being incremented (or decremented) by a fraction of a clock period on each iteration, until the DQ-DQS timing skew has been swept through an entire period of the data clock, i.e., the entire data eye. After iteratively sweeping the DQ-DQS timing skew through an entire clock period in this manner, based upon the results (i.e., matches and mis-matches between data that was written and data that was read) a determination is made as to the amount of timing delay by which each bit needs to be adjusted, and the corresponding CDCs are then adjusted accordingly. This iterative training using the MPC FIFO write/read method may require that the SDRAM system remain idle, i.e., otherwise inoperable, for a relatively long time while the training is being performed.

It is generally undesirable to maintain the SDRAM system in an idle state during normal or mission-mode operation of a device in which the SDRAM system is included, as the idle time or downtime implies memory latency that may adversely impact quality of service for a user of the device. Therefore, the MPC FIFO write/read method is commonly employed only infrequently, such as when the device is booted up. To periodically compensate for signal timing drift due to temperature changes during mission-mode operation without a noticeable impact on quality of service, the DQS clock-tree oscillator training method is commonly employed rather than the MPC FIFO write/read method.

In accordance with the present disclosure, it has been observed that although the DQS clock-tree oscillator method may avoid the performance (latency) disadvantage of the MPC FIFO write/read method, training accuracy using the DQS clock-tree oscillator method may suffer at very high memory speeds, such as, for example, at clock frequencies above 2133 MHz Therefore, a method for periodic DQ-DQS training using the MPC FIFO write/read method that seeks to minimize adverse impact on system latency in high-speed SDRAM systems would be desirable.

Methods and apparatuses for compensating for signal timing drift in an SDRAM system are presented in this disclosure. The methods and apparatuses perform periodic training using a MPC FIFO write/read method interspersed with mission-mode SDRAM operation in a way that minimizes SDRAM mission-mode traffic downtime. The term "mission-mode" as used in this disclosure in relation to SDRAM system operation refers to traffic between the SDRAM and a host that is initiated by a source not related to the aforementioned periodic training methods and apparatuses. Examples of sources of mission-mode SDRAM traffic may include central processing units or cores, graphical processing units, neural processing units, cameras, modems, etc.

As illustrated in FIG. 1, in an exemplary embodiment an apparatus 100 includes a processor system or host 102, an SDRAM 104, and a link 106 coupling the host 102 and the SDRAM 104. The link 106 carries mission-mode and training-mode traffic between the host 102 and the SDRAM 104. The SDRAM 104 may be, for example, a Low-Power DDR-SDRAM (LPDDR) operating in accordance with an LPDDR specification promulgated by Joint Electronic Device Engineering Council (JEDEC). The LPDDR specification may be, for example, LPDDR4 or LPDDR5.

The host 102 may be implemented as a system-on-chip (SoC) that includes multiple processors and other devices, interconnected by data buses or other interconnections (not shown for purposes of clarity). In some examples, the link 106 may be a chip-to-chip or a die-to-die link between the host 102 and the SDRAM 104, the host 102 and the SDRAM 104 being on separate dies. In other examples, the link 106 may be an in-die link, the host 102 and the SDRAM 104 being on the same die.

The apparatus 100 may comprise, for example, one of: a computing system (e.g., server, datacenter, desktop computer), a mobile or portable computing device (e.g., laptop, cell phone, vehicle, etc.), an Internet of Things (IoT) device, a virtual reality (VR) system, an augmented reality (AR) system, etc.

The host 102 may include at least one processor 108, which may control a portion of the methods described herein. Although not shown for purposes of clarity, the host 102 may further include other processors, such as, for example, a central processing unit (CPU), a digital signal processor (DSP), a graphics processing unit (GPU), a neural processing unit (NPU), etc., which may perform one or more mission-mode computing functions, such as data processing, data communication, graphic display, camera operation, AR or VR rendering, image processing, etc. In the course of its ordinary or mission-mode operation, the SDRAM 104 may service write and read operations initiated by such other processors under the control of, for example, application software. The host 102 may communicate data and commands with the SDRAM 104 via the link 106, either directly under the control of a processor or indirectly by a processor via a memory controller 110 or other intermediary device.

The processor 108 may operate under the control of firmware, which may include a periodic training controller 112 relating to the periodic training methods described below. Although in FIG. 1 the periodic training controller 112 is conceptually shown for purposes of clarity as resident in the processor 108, one of ordinary skill in the art understands that the periodic training controller (firmware) 112 may be stored in or reside in any storage location accessible to the processor 108, such as, for example, in a read-only memory (not shown) in the host 102 or connected to the host 102, in a remote cloud server memory, etc. The periodic training controller 112 may execute on the processor 108 in a conventional manner, which may include the processor 108 fetching instructions from such storage location on an as-needed basis. The processor 108 may execute the periodic training controller 112 to perform the methods (or portions thereof) described below with regard to FIGS. 3-9.

Figure 2:
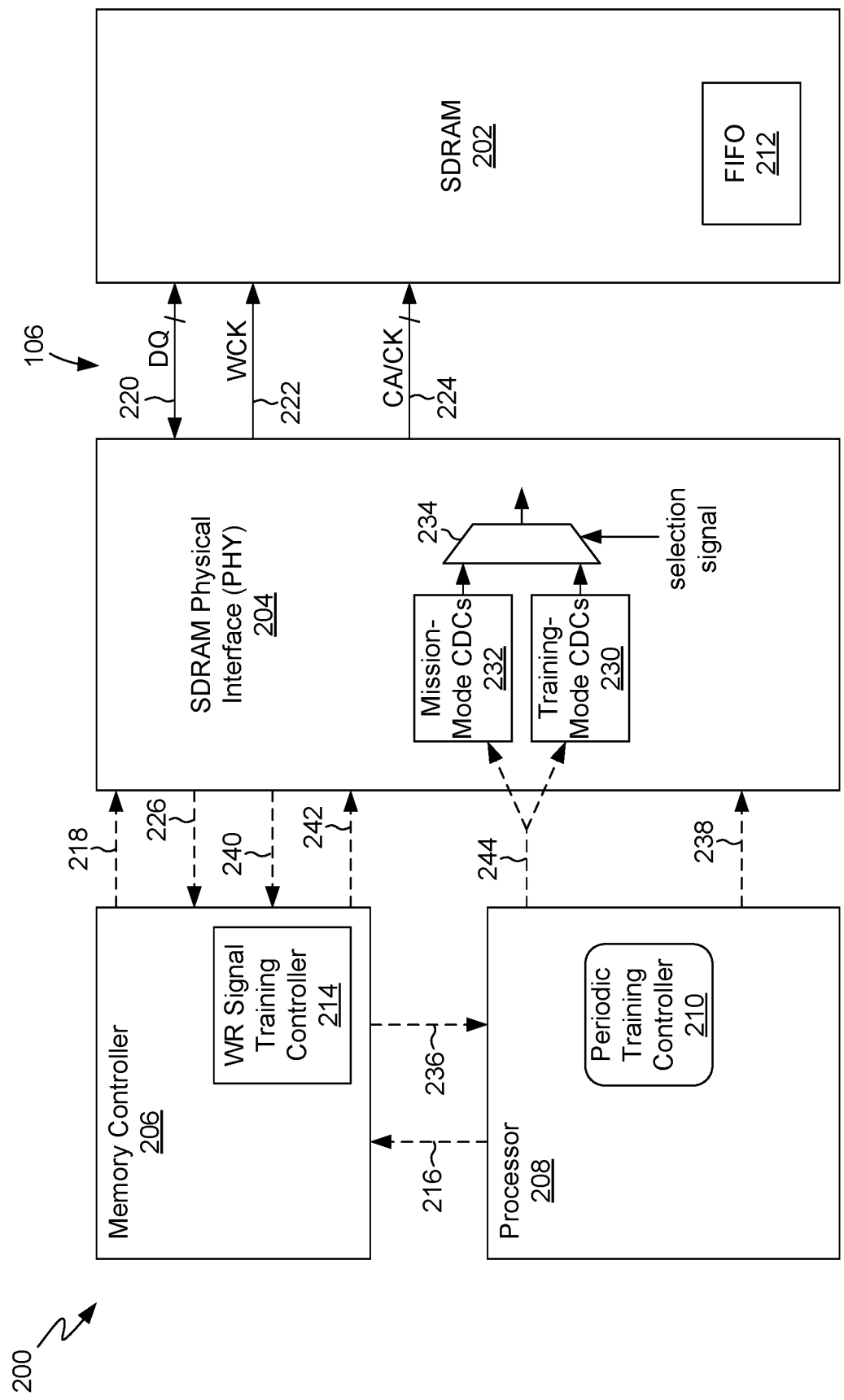
FIG. 2 is a block diagram illustrating another apparatus for compensating for signal timing drift in an SDRAM system, in accordance with certain aspects of the disclosure.

As illustrated in FIG. 2, a system 200 may include an SDRAM 202, an SDRAM PHY 204, a memory (i.e., SDRAM) controller 206, and a processor 208. The system 200 may be an example of the above-described system 100 (FIG. 1). More specifically, the SDRAM 202, memory controller 206, processor 208, and a periodic training controller 210 may be examples of the SDRAM 104, memory controller 110, processor 108, and periodic training controller 112, respectively, described above with regard to FIG. 1. The processor 208 may also be referred to as a system hardware resource manager (SHRM). That is, the processor 208 may be dedicated to hardware resource management and, as such, distinct from, and included in addition to, any CPU, GPU, etc. The memory controller 206 and the PHY 204 may conform in certain aspects to a DDR-PHY interface (DFI) specification, such as, for example, that which is promulgated by the DFI Group, an industry consortium.

The SDRAM 202 may include a FIFO 212. Other internal aspects of the SDRAM 202, such as a core storage array in which mission-mode data may be stored, are not shown for purposes of clarity but are well understood by one of ordinary skill in the art. The memory controller 206 may include a write (WR) signal training controller 214. The write signal training controller 214 may comprise, for example, a finite state machine or other logic. The write signal training controller 214 may be configured to control an MPC write signal timing training method, i.e., involving MPC FIFO write and MPC FIFO read commands (directed to the FIFO 212). As described below, the processor 208 may periodically send a training request 216 to the memory controller 206 to initiate performance of the MPC write signal timing training method. It should be noted that such requests, responses, and other communications sent and received among the processor 208, memory controller 206, and PHY 204 are shown in a conceptual manner in FIG. 2, as indicated by the broken-line arrows. Physically, each such communication may be embodied as one or more signals carried on one or more signal lines, buses, etc., which are not shown in FIG. 2 for purposes of clarity.

In response to the training request 216, the memory controller 206 may send MPC FIFO write and read commands 218 to the PHY 204. The memory controller 206 may also provide test data values. In response to each MPC write command and accompanying operand indicating a periodic training mode operation, the PHY 204 may issue signals to the SDRAM 202 over buses and other signal lines, which may include a data (DQ) bus 220, a write clock (WCK) signal line 222, and a command/address/clock (CA/CK) bus 224. In response to such signals, the SDRAM 202 may write a test data value to the FIFO 212. In response to each MPC read command, the PHY 204 may similarly issue signals in response to which the SDRAM 202 reads a resulting data value from the FIFO 212 (i.e., from the FIFO location corresponding to the location to which the test data value was written). The PHY 204 receives the resulting data values from the SDRAM 202 via the DQ bus 220 and provides the resulting data values in a read response 226 to the memory controller 206. Examples of the manner in which the results of the write signal timing training method may be analyzed and used are described below.

The DQ bus 220 comprises multiple signal lines, each corresponding to one bit of the data value and thus carrying one data bit signal. For example, the DQ bus 220 may comprise eight signal lines DQ0-DQ7 (not individually shown in FIG. 2) for each rank in the SDRAM 202. The PHY 204 may control the timing of the data bit signals relative to the write clock signal. During an MPC FIFO write, the PHY 204 may select training-mode CDCs 230 to apply an amount of delay to the data bit signals relative to the write clock signal determined by training-mode settings stored in a configurable register of the training-mode CDCs 230. During a mission-mode write, the PHY 204 may select mission-mode CDCs 232 to apply an amount of delay to the data bit signals relative to the write clock signal determined by mission-mode timing settings stored in a configurable register of the mission-mode CDCs 232. The amount of delay that the CDC 230 or 232 applies may be configured on a per-bit basis. Multiplexing logic 234 may be included to select between applying the training-mode CDCs 230 and applying the mission-mode CDCs 232 to the data bit signals. Examples of the manner in which settings may be determined, stored in the CDCs 230 and 232, and selectively applied to the data bit signals are described below.

Figure 3:
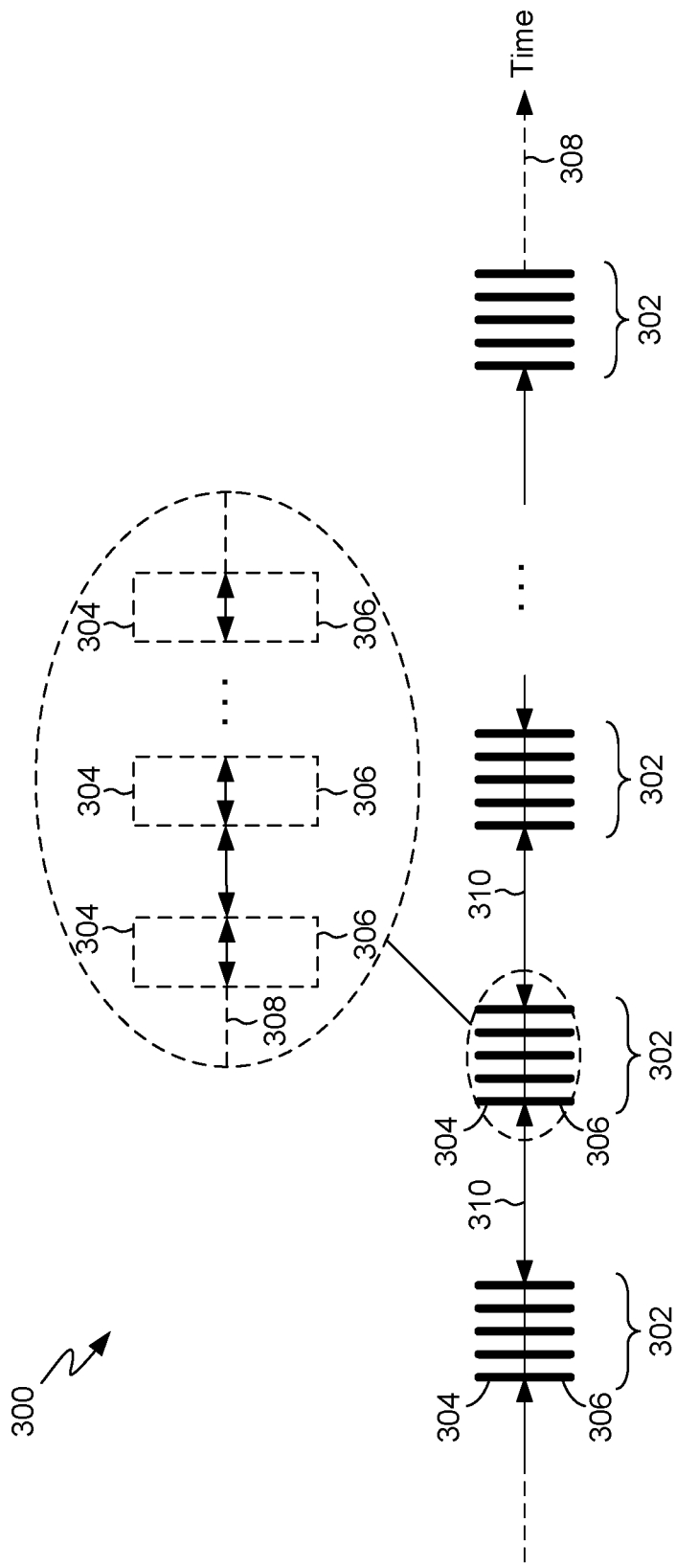
FIG. 3 is a timing diagram conceptually depicting successive clusters or bursts of MPC FIFO writes and reads, in accordance with certain aspects of the disclosure.

As illustrated in FIG. 3, a timing diagram 300 conceptually depicts successive clusters or bursts 302 of MPC FIFO writes 304 and reads 306 along a time axis 308. The bursts 302 occur at periodic time intervals 310, and each burst 302 may correspond to one instance of performing MPC write signal timing training. As described below, the MPC write signal timing training is performed multiple times at periodic time intervals 310 to obtain a corresponding number of test result samples, which may be analyzed to determine how to adjust mission-mode SDRAM timing settings.

Each MPC FIFO write 304 is conceptually depicted in FIG. 3 as an element extending above the time axis 308, and each MPC FIFO read 306 is conceptually depicted as an element extending below the time axis 308. As FIG. 3 is conceptual in nature, such elements should not be interpreted as having dimensions or directions, and there is no axis perpendicular to the time axis 308. Although in the illustrated example each burst 302 comprises five MPC FIFO writes 304 and five MPC FIFO reads 306, in other examples such a burst may comprise any other number of one or more MPC FIFO writes and a corresponding number of MPC FIFO reads. In the illustrated example, each burst 302 may correspond to one instance of performing MPC write signal timing training that correspondingly provides one test result sample. As described below, a burst 302 of multiple (e.g., five) MPC FIFO write and read pairs per instance of periodic MPC write signal timing training rather than only a single MPC FIFO write and read pair per instance of MPC write signal timing training provides a feature by which the results of the multiple MPC FIFO reads 306 of each burst 302 may be processed to determine an overall test result sample for that entire burst 302 or instance of MPC write signal timing training, such as "pass" or "fail." This processing may comprise a form of averaging or filtering. Nevertheless, in other exemplary embodiments (not shown) each instance of performing MPC write signal timing training may consist of as few as one MPC FIFO write and read pair.

Significantly, while MPC write signal timing training is being performed multiple times to gather multiple test result samples for analysis, mission-mode SDRAM traffic may proceed uninterrupted during the periodic time intervals 310 between successive bursts 302 or instances of MPC write signal timing training. That is, the MPC write signal timing training is interspersed with mission-mode SDRAM traffic. The duration of each periodic time interval 310 may depend on the type of MPC write signal timing training employed. Two examples of MPC write signal timing training are described further below.

Figure 4:
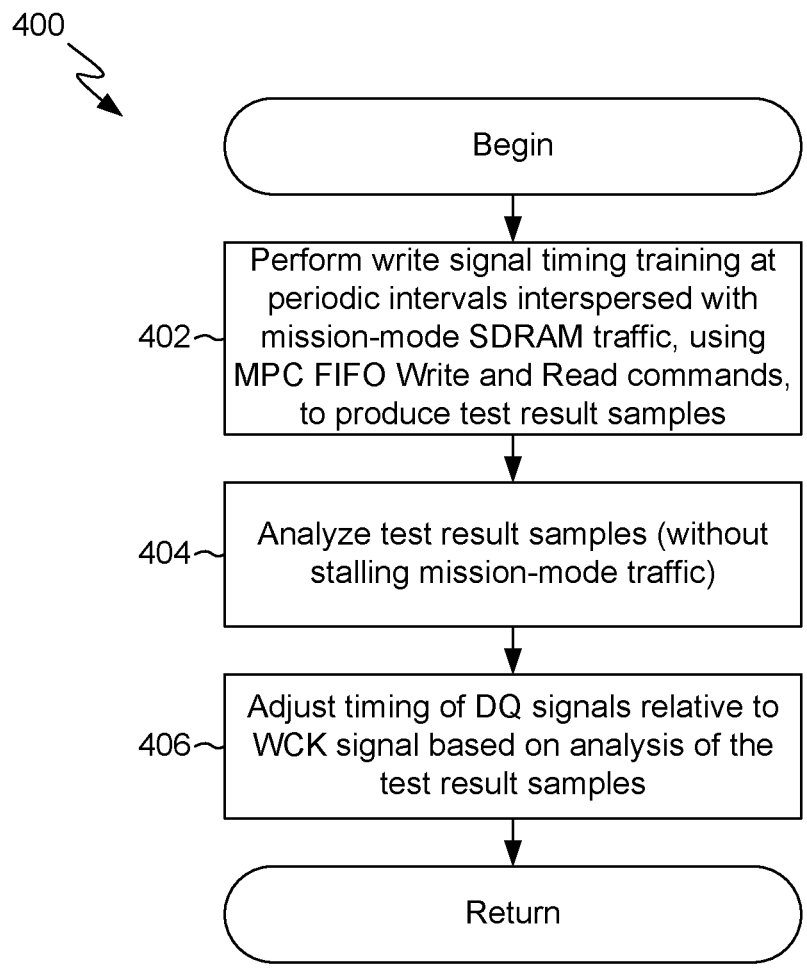
FIG. 4 is a flow diagram, illustrating a method for compensating for signal timing drift in an SDRAM system, in accordance with certain aspects of the disclosure.

As illustrated in FIG. 4, a method 400 for compensating for signal timing drift in an SDRAM system may include performing MPC write signal timing training a plurality of times at periodic intervals interspersed with mission-mode SDRAM traffic, as indicated by block 402. The write signal timing training may use the above-described MPC FIFO write and MPC FIFO read. The MPC write signal timing training may be performed two or more times to produce a corresponding number of test result samples. The method 400 may further include analyzing the test result samples, as indicated by block 404. It should be noted that the analysis may be performed independently of mission-mode SDRAM traffic, i.e., in the background or substantially in parallel with mission-mode traffic. The analysis does not interrupt or stall mission-mode SDRAM traffic. The method 400 may still further include adjusting the timing of the data bit signals relative to the write clock signal based on the analysis, as indicated by block 406.

Figure 5A:
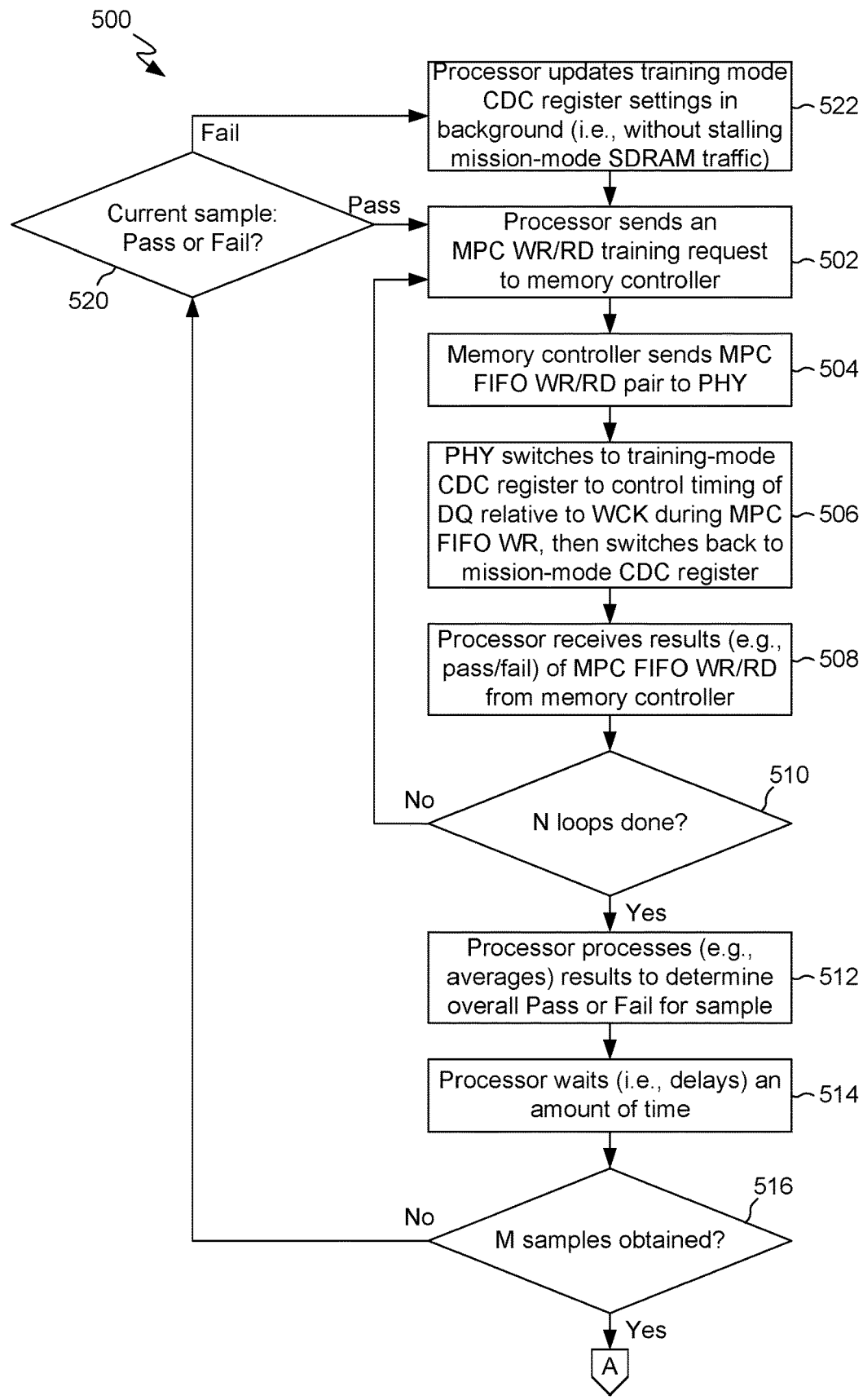
FIG. 5A is a flow diagram, illustrating another method for compensating for signal timing drift in an SDRAM system, in accordance with certain aspects of the disclosure.
Figure 5B:
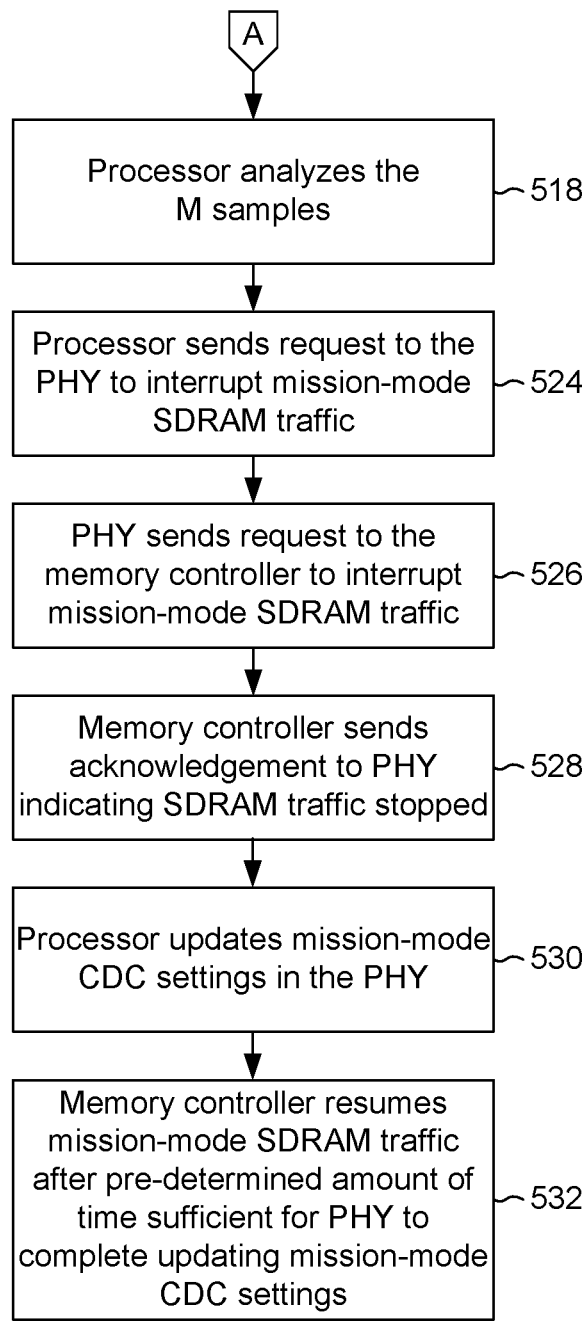
FIG. 5B is a continuation of the flow diagram of FIG. 5A.

As illustrated in FIG. 5, a method 500 for compensating for signal timing drift in an SDRAM system may be described with reference to the above-described system 200 (FIG. 2). The method 500 may be an example of the above-described method 400 (FIG. 4).

As indicated by block 502, the processor 208 (FIG. 2) may periodically send a training request 216 to the memory controller 206. As indicated by block 504, in response to the training request 216 the memory controller 206 may send MPC FIFO write and MPC FIFO read commands 218 to the PHY 204. The memory controller 206 may also provide a test data value to the PHY 204 along with each MPC FIFO write command. The PHY 204 sends the MPC FIFO write and MPC FIFO read commands to the SDRAM 202 over the CA/CK bus 224.

As indicated by block 506, in response to the MPC FIFO write command 218 (FIG. 2), the PHY 204 switches from selecting the mission-mode CDCs 232 to selecting the training-mode CDCs 230. That is, the delay that the PHY 204 applies to the data bit signals is determined by the (newly selected) training-mode CDCs 230 instead of the (previously selected) mission-mode CDCs 232. The PHY 204 continues to apply the training-mode CDCs 232 for the duration of the burst 302 (FIG. 3) of MPC FIFO writes and MPC FIFO reads. When the burst 302 of MPC FIFO writes and MPC FIFO reads is completed, the PHY 204 switches back from selecting the training-mode CDCs 230 to again selecting the mission-mode CDCs 232. The PHY 204 then continues to apply to the data bit signals the delay determined by the mission-mode CDCs 232 for the duration of the time interval 310 (FIG. 3).

As indicated by block 508, in response to the MPC FIFO read command the PHY 204 receives from the SDRAM 202 a resulting data value (read from the same FIFO location to which the test data value was written), which the PHY 204 sends as the read response 226 to the memory controller 206. The memory controller 206 may compare the test data value that was written to the FIFO 212 with the corresponding resulting data value that was read from the FIFO 212 to determine whether they match. A match between the test data value and resulting data value may also be referred to as a pass, and a mis-match between the test data value and resulting data value may also be referred to as a fail. Information indicating a pass, fail, or other result of comparing a test data value with a resulting data value may be referred to as a result 236, which the memory controller 206 may provide to the processor 208.

As indicated by block 510, the processor 208 may obtain multiple results 236 in the manner described above. That is, the method 500 may loop through blocks 502, 504, 506 and 508 a number (N) of times to thereby obtain N results 236. In the example described above with regard to FIG. 5, N=5. After N loops through blocks 502-508, the method 500 proceeds to block 512.

As indicated by block 512, the processor 208 may process the N results 236 to determine an overall result or test result sample, such as pass or fail. This processing may comprise a form of averaging, voting, filtering, or similar processing. For example, this processing may comprise determining the number of passes and the number of fails among the N results 236, and determining that the test result sample is a pass if the number of passes is greater than the number of fails, or that the test result sample is a fail if the number of fails is greater than the number of passes. Although for purposes of brevity the term "averaging" may be used herein to refer to such processing, and the term "average" may be used herein to refer to the result of such processing, the term is not limited to a mathematical mean.

As indicated by block 514, the processor 208 may wait (i.e., delay further processing relating to the method 500) a certain amount of time, such as, for example, some number of milliseconds. The amount of time may substantially correspond to the above-described periodic time interval 310 (FIG. 3). As each test result sample is obtained, the processor 208 may use the test result sample to adjust the (training-mode) timing of the data bit signals relative to the write clock signal that is applied during acquisition of the next test result sample.

As indicated by block 516, if a number (M) of test result samples have been obtained in the manner described above, the method 500 proceeds to block 518 (FIG. 5B). If M test result samples have not yet been obtained, the processor 208 may determine whether the current (i.e., most recently obtained) test result sample is a pass or a fail, as indicated by block 520. In the context of block 520, and as described below, a fail result may include additional information that may be used to adjust the training-mode timing that is applied to the data bit signals during acquisition of the next sample.

If the result of the pass/fail determination (block 520) is a pass, the method 500 may return to above-described block 502, where the processor 208 then sends the next periodic training request 216 to the memory controller 206. If the result of the pass/fail determination (block 520) is a fail, the method 500 may proceed to block 522. As indicated by block 522, the processor 208 may update the training-mode timing settings stored in a register of the training-mode CDCs 230 (FIG. 2). The processor 208 may update the training-mode timing settings without stalling mission-mode SDRAM traffic, i.e., in the background or in parallel with mission-mode SDRAM traffic. Note that while the processor 208 updates the training-mode timing settings in the training-mode CDCs 230, the mission-mode timing determined by the mission-mode CDCs 232 is being applied to the data bit signals (i.e., mission-mode SDRAM traffic) and continues, uninterrupted by the present methods, to be applied until such time as the PHY 204 may again switch from selecting the mission-mode CDCs 232 to selecting the training-mode CDCs 230 as described above with regard to block 506. Following block 522, the method 500 may return to above-described block 502, where the processor 208 then sends the next periodic training request 216 to the memory controller 206.

As indicated by block 518, the processor 208 may analyze the M samples that have been obtained. The manner in which the processor 208 analyzes the M samples and determines a result may depend upon the type of MPC write signal timing training method that is employed. Two examples of such an analysis are described below with regard to two examples of MPC write signal timing training methods (FIGS. 6A-9).

As indicated by block 524, in preparing to analyze the M samples and update mission-mode timing settings, the processor 208 may send a request 238 (FIG. 2) to the PHY 204 to prepare the PHY 204 for having its mission-mode CDCs 232 updated. As indicated by block 526, the PHY 204, in turn, may send a request 240 (FIG. 2) to the memory controller 206 to temporarily stop (i.e., interrupt) SDRAM traffic. As indicated by block 528, the memory controller 206 may send an acknowledgement 242 (FIG. 2) to the PHY 204 indicating that the memory controller 206 has stopped SDRAM traffic.

As indicated by block 530, the processor 208 may then provide updated mission-mode timing settings 244 (FIG. 2) to the PHY 204 for storage in the mission-mode CDCs 232. After the updated mission-mode timing settings have been stored in the mission-mode CDCs 232, the PHY 204 may switch the multiplexing logic 234 from selecting the output of the training mode-CDCs 230 to selecting the output of the mission-mode CDCs 232. That is, the multiplexing logic 234 ceases to cause the training-mode timing (delay) settings from being applied to the data bit signals and instead causes the mission-mode timing (delay) settings to be applied to the data bit signals. As indicated by block 532, the memory controller 206 may resume mission-mode SDRAM traffic after a predetermined amount of time sufficient to allow the PHY 204 to complete storing the updated mission-mode timing settings and the multiplexing logic 234 to complete switching. The mission-mode timing settings continue to be applied to the data bit signals until, as described above with regard to block 506, the PHY 204 again switches from selecting the mission-mode CDCs 232 to selecting the training-mode CDCs 230.

Note that the total downtime in the method 500, i.e., time during which mission-mode SDRAM traffic is interrupted, consists of the time during the switch from selecting the mission-mode timing settings to selecting the training-mode timing settings, the time taken by the bursts of MPC FIFO write and read pairs, as described above with regard to block 506, and the time during the switch from selecting the mission-mode timing settings to selecting the training-mode timing signals, as described above with regard to block 530. The processor 208 analyzes the M test result samples without stalling mission-mode SDRAM traffic, i.e., in the background or in parallel with mission-mode SDRAM traffic, and only causes the mission-mode CDCs 232 to be updated once the analysis is complete. The outputs of the mission-mode CDCs 232 are unable to be applied to the data bit signals only while the mission-mode CDCs 232 are being updated and switched.

A significant factor in minimizing this downtime is the duration of the MPC write signal timing training method, including obtaining and analyzing the M test result samples. The following are two examples of MPC write signal timing training methods that may be employed. Each of these MPC write signal timing training methods may quickly converge upon updated mission-mode timing settings because they may be performed at frequent periodic intervals.

Figure 6C:
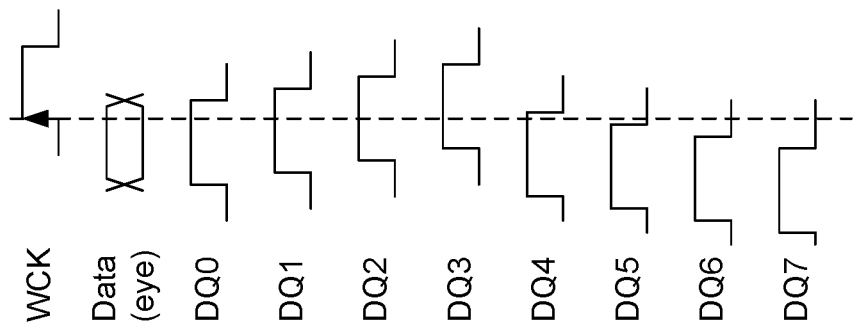
FIG. 6C is similar to FIGS. 6A-6B, showing an example of early arrival of the data bit signals relative to the write clock signal.
Figure 6B:
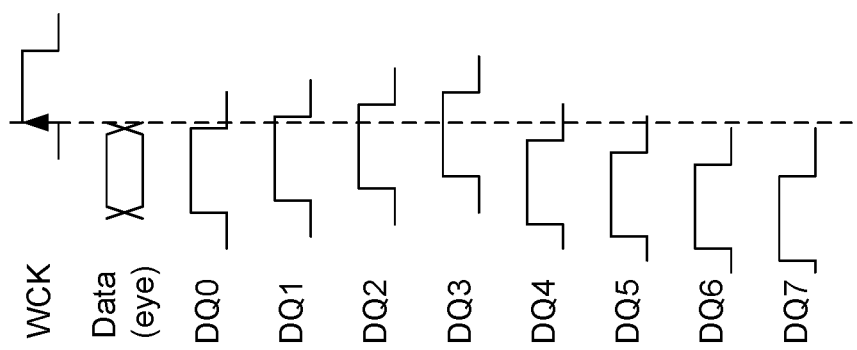
FIG. 6B is similar to FIG. 6A, showing an example of late arrival of the data bit signals relative to the write clock signal.
Figure 6A:
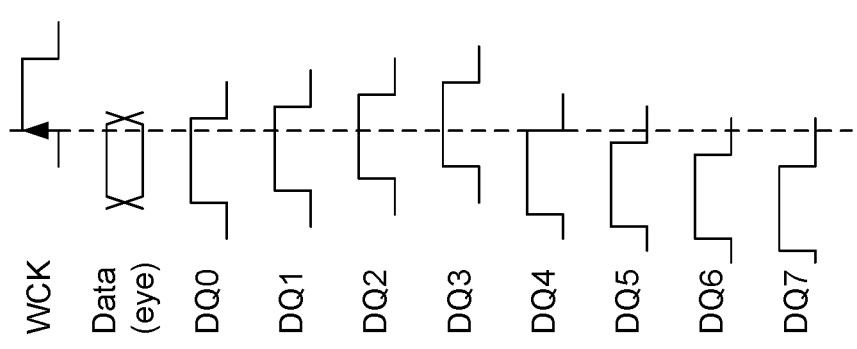
FIG. 6A is a timing diagram illustrating an example of MPC write signal timing training that uses a per-bit skew, in accordance with certain aspects of the disclosure.

As illustrated in FIGS. 6A-6C, in a first MPC write signal timing training method the PHY 204 may skew or delay each data bit signal DQ0-DQ7 in time by a different amount relative to the write clock signal WCK. The amount of skew applied to each data bit signal is less than the length or period of the data eye. For example, each of eight data bit signals DQ0-DQ7 may be skewed by an amount of time, which may be referred to as a "tick," that is one-eighth the period of the data eye. The data bit signals DQ0-DQ7 may be skewed relative to their current training-mode timing settings (and thus also relative to the write clock signal WCK). For example: DQ0 may be skewed by zero ticks from its current training-mode timing setting; DQ1 may be skewed by an increment of one tick from its current training-mode timing setting; DQ2 may be skewed by an increment of two ticks from its current training-mode timing setting; and DQ3 may be skewed by an increment of three ticks from its current training-mode timing setting, while DQ4 may be skewed by a decrement of one tick from its current training-mode timing setting; DQ5 may be skewed by a decrement of two ticks from its current training-mode timing setting; DQ6 may be skewed by a decrement of three ticks from its current training-mode timing setting; and DQ7 may be skewed by a decrement of four ticks from its current training-mode timing setting. The PHY 204 may use the training-mode CDCs 230 to apply this skew to each data bit signal DQ0-DQ7.

The PHY 204 may then cause a test data value to be written to a location in the FIFO 212 of the SDRAM 202. The test data value is written using the skewed timing. As described above with regard to the general operation of a MPC write signal timing training method, the PHY 204 may then read the same location in the FIFO 212 to obtain the resulting bit pattern.

A first example of an MPC write signal timing training method is illustrated in FIGS. 6A-6C. This method uses a per-bit skew to capture a pattern indicating whether the data bit signals (DQ0-DQ7) arrive at the SDRAM 202 at a proper or satisfactory time relative to the write clock signal (WCK), arrive too late relative to WCK, or arrive too early relative to WCK. The test data value may be, for example, "11111111" (i.e., all "1"s). Alternatively, the same principles described herein may be applied in an example in which the test data value is "10101010" (i.e., alternating "1"s and "0"s).

As illustrated in FIG. 6A, a read data value or pattern of "00001111" (i.e., DQ[3:0]="1111" and DQ[7:4]="0000") results from the skewed timing of the data bits signals DQ0-DQ7 relative to the write clock signal WCK when the data bit signals DQ0-DQ7 arrive at the SDRAM 202 in proper time relation with WCK. In other words, in the example illustrated in FIG. 6A a data value of "11111111" is written to a location in the FIFO 212, and a data value of "00001111" (i.e., DQ[3:0]="1111" and DQ[7:4]="0000") is read from that location in the FIFO 212. In view of the applied skew, the result of the test is a pass because all of the bits that were incremented in time read "1" and all of the bits that were decremented in time read "0". This result indicates that the applied timing skew results in the data bit signals DQ0-DQ7 arriving at the SDRAM 202 neither late nor early (i.e., on time) relative to WCK. This result thus also indicates that WCK has not drifted since the previous iteration of the MPC write signal timing training method. In other words, the current training-mode timing settings of all data bit signals DQ0-DQ7 are proper and do not need to be adjusted.

In the example illustrated in FIG. 6B, a data value of "11111111" is likewise used as a test data value as described above with regard to FIG. 6A. However, a read data value or pattern of "00000111" (i.e., DQ[3:0]="0111" and DQ[7:4]="0000") results from the skewed timing of the data bits signals DQ0-DQ7 relative to the write clock signal WCK when the data bit signals DQ0-DQ7 arrive at the SDRAM 202 too early relative to WCK. In other words, in the example illustrated in FIG. 6B a data value of "11111111" is written to a location in the FIFO 212, and a data value of "00000111" (i.e., DQ[3:0]="0111" and DQ[7:4]="0000") is read from that location in the FIFO 212. In view of the applied skew, the result of the test is a fail in this example because not all of the bits that were incremented in time read "1". Rather, as DQ[3:0] read "0111" the "0" value of DQ3 indicates that the applied timing skew results in the data bit signals DQ0-DQ7 arriving at the SDRAM 202 too early relative to WCK. This result thus indicates that WCK has drifted ahead in time relative to the data bit signals DQ0-DQ7 since the previous iteration of the MPC write signal timing training method. Accordingly, to re-align the data eye with WCK, all of the data bit signals DQ0-DQ7 need to be adjusted ahead in time (i.e., incremented) by one tick. The number of bits that were incremented in time but do not read "1" in DQ[3:0] can be interpreted as a form of thermometer code, indicating how many ticks to increment the data bit signals DQ0-DQ7.

In the example illustrated in FIG. 6C, a data value of "11111111" is likewise used as a test data value as described above with regard to FIGS. 6A-6B. However, a read data value or pattern of "00011111" (i.e., DQ[3:0]="1111" and DQ[7:4]="0001") results from the skewed timing of the data bits signals DQ0-DQ7 relative to the write clock signal WCK when the data bit signals DQ0-DQ7 arrive at the SDRAM 202 too late relative to WCK. In other words, in the example illustrated in FIG. 6B a data value of "1111111" is written to a location in the FIFO 212, and a data value of "00011111" (i.e., DQ[3:0]="1111" and DQ[7:4]="0001") is read from that location in the FIFO 212. In view of the applied skew, the result of the test is fail in this example because not all of the bits that were decremented in time read "0". Rather, as DQ[7:4] read "0001" the "1" value of DQ4 indicates that the applied timing skew results in the data bit signals DQ0-DQ7 arriving at the SDRAM 202 too late relative to WCK. This result thus indicates that WCK has drifted behind in time relative to the data bit signals DQ0-DQ7 since the previous iteration of the MPC write signal timing training method. Accordingly, to re-align the data eye with WCK, all of the data bit signals DQ0-DQ7 need to be adjusted behind in time (i.e., decremented) by one tick. The number of bits that were decremented in time but do not read "0" in DQ[7:4] can be interpreted as a form of thermometer code, indicating how many ticks to decrement the data bit signals DQ0-DQ7.

Accordingly, in the analysis phase described above with regard to block 518 (FIG. 5B) or block 404 (FIG. 4), the processor 208 may determine from the M test samples whether to adjust the mission-mode timing settings (i.e., delay values) with settings that are greater than, less than, or the same as the then-current settings. If it is determined that the data bit signals arrived early relative to WCK, the processor 208 may update or calibrate the mission-mode timing settings by incrementing the delay values represented by the mission-mode timing settings. If it is determined that the data bit signals arrived late relative to WCK, the processor 208 may update or calibrate the mission-mode timing settings by decrementing the delay values represented by the mission-mode timing settings. If it is determined that the data bit signals arrived neither early nor late relative to WCK, the processor 208 may update or calibrate the mission-mode timing settings by maintaining the same delay values (i.e., an adjustment of zero) represented by the mission-mode timing settings.

Figure 7:
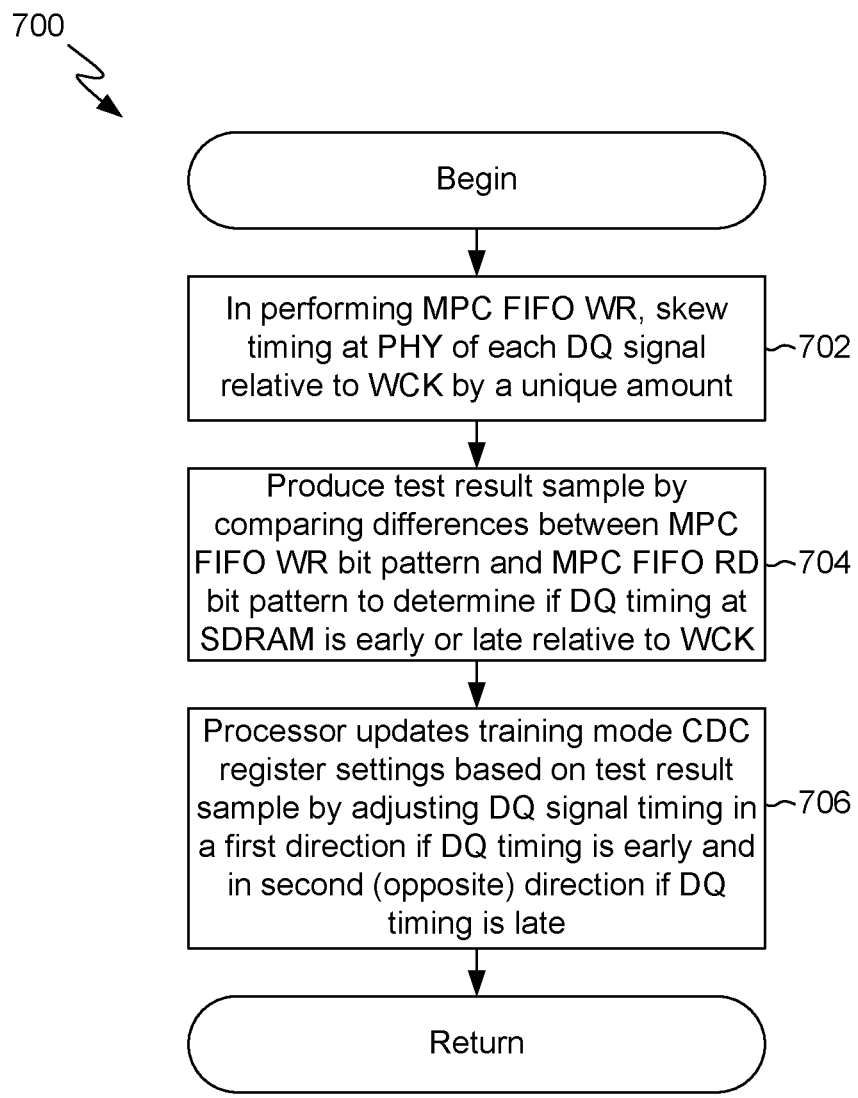
FIG. 7 is a flow diagram, illustrating an MPC write signal timing training method, in accordance with certain aspects of the disclosure.

As illustrated in FIG. 7, an MPC write signal timing training method 700 may encompass the example described above with regard to FIGS. 6A-6C. The method 700 may represent an example of a portion of the method 400 (FIG. 4), such as the portion represented by block 402, or a portion of the method 500 (FIG. 5), such as the portion represented by one or more of blocks 506-516.

As indicated by block 702, in writing a test data value to the FIFO register 212 of the SDRAM 202 the data bit signals may be skewed in time relative to WCK and each other. That is, the data bit signals may be skewed by different amounts (each less than the data eye period), and all data bit signals may be skewed in time so that they arrive at the SDRAM 202 from the PHY 204 properly aligned with WCK, early relative to WCK, or late relative to WCK. The data value represented by the plurality of data bit signals having the skewed timing is then written to and read back from the FIFO register 212 of the SDRAM 202 using the MPC FIFO write and MPC FIFO read. The resulting data value that is read back has a bit pattern. Although not shown in the method 700, one or more resulting data values may be obtained in this manner.

As indicated by block 704, the method 700 may include producing a result or test result sample by comparing the resulting data value that was read back from a location in the FIFO register 212 with an expected pattern based on the corresponding test data value that was written to that location and the applied skew to determine bit differences between the resulting data value and the expected pattern. As described above with regard to FIGS. 6A-6C, the bit differences may indicate one of: early arrival of the data bit signals at the SDRAM 202 from the PHY 204 relative to WCK; late arrival of the data bit signals at the SDRAM 202 from the PHY 204 relative to WCK; and properly timed arrival of the data bit signals at the SDRAM 202 from the PHY 204 relative to WCK.

As indicated by block 706, the method 700 may include updating the training-mode timing settings by adjusting timing of the plurality of data bit signals in a first direction (e.g., incrementing the delay) relative to WCK if the bit difference indicates early arrival of the data bit signals and adjusting the timing of the plurality of data bit signals in a second direction (e.g., incrementing the delay) relative to WCK if the bit difference indicates late arrival of the data bit signals.

Although not shown in FIG. 7 for purposes of clarity, the method 700 may be repeated one or more times to correspondingly acquire a number (M) of test result samples, each time updating the training-mode timing settings. Among the M test result samples may be test result samples that indicate the data bit signals arrived early, late or in proper timing relative to WCK. As described above with regard to block 518-530 (FIG. 5B) or blocks 404-406 (FIG. 4), the processor 208 may then analyze the M test result samples and, based on the results of the analysis, adjust the mission-mode timing settings.

Figure 8B:
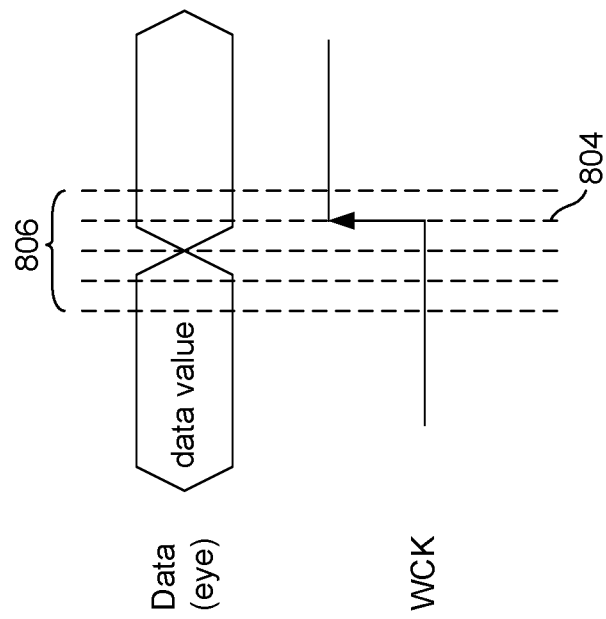
FIG. 8B is similar to FIG. 8A, showing an example of early arrival of the data bit signals relative to the write clock signal.
Figure 8A:
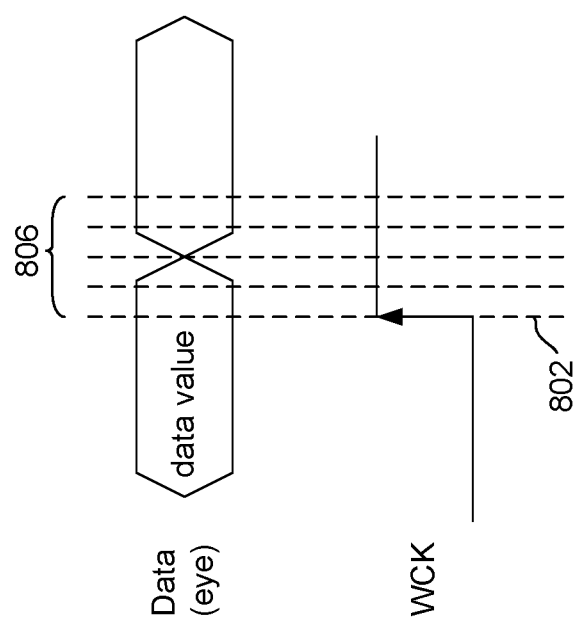
FIG. 8A is a timing diagram illustrating an example of MPC write signal timing training involving an eye corner search, in accordance with certain aspects of the disclosure.

Another example of an MPC write signal timing training method is illustrated in FIGS. 8A-8B. This method searches for a corner or edge of the data eye by incrementing or decrementing the amount of delay applied to the data bit signals in fine steps (i.e., less than the width of the data eye).

As illustrated in FIGS. 8A-8B, a data value (represented by all data bit signals together, forming a data eye) may be written to a location in FIFO 212 of the SDRAM 202 by the rising edge of WCK. No skew is applied to the data bit signals individually with respect to each other or with respect to WCK. The resulting data value that is read from that location in the FIFO 212 is compared with the data value that was written. If the resulting data value that is read does not match the test data value that was written, the result of the test is a fail. If the resulting data value that is read does not match the test data value that was written, the result of the test is a fail. For example, FIG. 8A may illustrate an instance in which the data bit signals arrive at the SDRAM 202 from the PHY 204 aligned in time properly with the rising edge of WCK at a time 802, resulting in a pass when the resulting data value that is read from that location in the FIFO 212 is compared with the data value that was written. However, FIG. 8B may illustrate, for example, an instance in which the data bit signals arrive at the SDRAM 202 from the PHY 204 too early with respect to the rising edge of WCK at a time 804, resulting in a fail when the resulting data value that is read from that location in the FIFO 212 is compared with the data value that was written.

If the initial result is a pass, then the timing of the data bit signals (i.e., the delay relative to the write clock signal) may be decremented by a step amount, such as one eighth of the eye width. If the result is again a pass, then the timing of the data bit signals may be decremented again by the step amount. The timing of the data bit signals may be decremented repeatedly in this manner until the result changes from a pass to a fail, indicating that one or more of the data bit signals are transitioning at the time the rising edge of WCK occurs and thus indicating the location of the eye corner.

Similarly, if the initial result is a fail, then the timing of the data bit signals may be incremented by the step amount. If the result is again a fail, then the timing of the data bit signals may be incremented again. The timing of the data bit signals may be incremented repeatedly in this manner until the result changes from a fail to a pass, indicating that one or more of the data bit signals are transitioning at the time the rising edge of WCK occurs and thus indicating the location of the eye corner.

Because the MPC write signal timing training method is performed periodically, interspersed with mission-mode operation of the SDRAM 202, the analysis is unlikely to determine that the mission-mode timing deviates substantially from the proper timing. Rather, the analysis is more likely to determine that the mission-mode timing of the data bit signals with respect to WCK deviates only a small amount relative to the width of the data eye. In an example in which the data eye is considered as having a width of eight steps, it is likely that the mission-mode timing of the data bit signals with respect to WCK is within a range 806 of a small number of steps of the proper timing at the time the MPC write signal timing training method is performed. In an example in which the data eye spans eight steps, only three or four steps and thus three or four repetitions of the MPC write signal timing training method may be needed to provide a sufficient number of samples (i.e., M=3 or M=4) for the subsequent analysis to determine the amount by which to update or calibrate the mission-mode timing settings.

Figure 9:
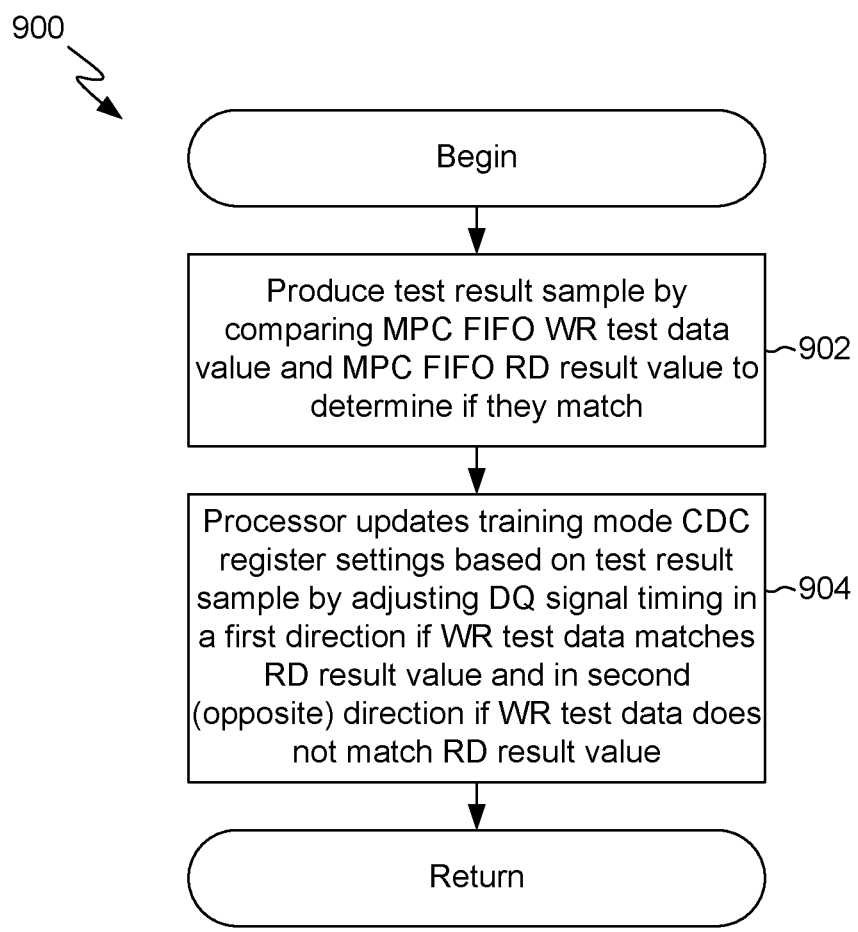
FIG. 9 is a flow diagram, illustrating another MPC write signal timing training method, in accordance with certain aspects of the disclosure.

As illustrated in FIG. 9, an MPC write signal timing training method 900 may encompass the example described above with regard to FIGS. 8A-8B. The method 900 may represent an example of a portion of the method 400 (FIG. 4), such as the portion represented by block 402, or a portion of the method 500 (FIG. 5), such as the portion represented by one or more of blocks 506-516.

As indicated by block 902, a data value is written to and read back from a location in the FIFO register 212 of the SDRAM 202 using the MPC FIFO write and MPC FIFO read. A test result or sample is produced by comparing the resulting data value that was read back with the corresponding test data value that was written to determine if they match.

As indicated by block 904, the method 700 may include updating or calibrating the training-mode timing settings by adjusting timing of the data bit signals in a first direction (e.g., decrementing the delay) relative to WCK if the initial test result was a pass and in a second direction (e.g., incrementing the delay) relative to the write clock signal if the initial test result was a fail. Blocks 902 and 904 may be repeated until the test result changes. Alternatively, blocks 902 and 904 may be repeated a fixed number (M) of times. As described above with regard to block 518-530 (FIG. 5B) or blocks 404-406 (FIG. 4), the processor 208 may then analyze the samples and, based on the results of the analysis, update or calibrate the mission-mode timing settings. The processor 208 may, for example, adjust the mission-mode timing settings to match a training mode setting that resulted in a pass.

The foregoing description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, and are to be accorded the full scope consistent with the language of the claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
a synchronous dynamic random access (SDRAM) system comprising an SDRAM, a memory controller, and a physical interface (PHY) configured to couple the SDRAM with the memory controller; and
a processor system configured to:
transmit to the memory controller a plurality of requests to initiate write signal timing training, the plurality of requests transmitted at periodic intervals interspersed with mission-mode SDRAM traffic between the SDRAM and the memory controller, the write signal timing training using a multi-purpose command (MPC) first-in-first-out (FIFO) write and MPC FIFO read, the write signal timing training performed a plurality of times producing a corresponding plurality of test result samples;
receive the plurality of test result samples from the memory controller independently of mission-mode SDRAM traffic between the SDRAM and the memory controller;
analyze the plurality of test result samples independently of mission-mode SDRAM traffic between the SDRAM and the memory controller; and
provide mission-mode timing settings to the PHY based on an analysis of the plurality of test result samples.

2. The apparatus of claim 1, wherein the PHY includes mission-mode configurable delay cell (CDC) circuitry, training-mode CDC circuitry, and selection circuitry configured to apply to a plurality of SDRAM data bit signals relative to an SDRAM write clock signal a selected one of the mission-mode timing settings using the mission-mode CDC circuitry and training-mode timing settings using the training-mode CDC circuitry.

3. The apparatus of claim 2, wherein the PHY is configured to:
receive the mission-mode timing settings from the processor system;
interrupt mission-mode SDRAM traffic operation to configure the mission-mode CDC circuitry with the mission-mode timing settings;
configure the mission-mode CDC circuitry with the mission-mode timing settings while mission-mode SDRAM traffic is interrupted; and
resume mission-mode SDRAM traffic operation after configuring the mission-mode CDC circuitry with the mission-mode timing settings.

4. The apparatus of claim 2, wherein the memory controller is configured, in response to each request to initiate the write signal timing training, to:
write a test data value represented by a plurality of SDRAM data bit signals using the MPC FIFO write, wherein the PHY applies the training-mode timing settings to the plurality of SDRAM data bit signals relative to the SDRAM write clock signal during the MPC FIFO write;
after the test data value is written, read a resulting data value represented by the plurality of SDRAM data bit signals using the MPC FIFO read;
compare the resulting data value with the test data value; and
provide a result of comparing the resulting data value with the test data value to the processor system.

5. The apparatus of claim 4, wherein the processor system is configured to:
initiate write signal timing training a plurality (M) of times to obtain M test result samples, and each time the write signal timing training is initiated, to initiate a plurality (N) of MPC FIFO writes to N FIFO register locations and N MPC FIFO reads from the N FIFO register locations to obtain N results; and
average the N results to produce one of the M test result samples.

6. The apparatus of claim 4, wherein the processor system is configured to, at each periodic interval:
transmit the request to initiate the write signal timing training to the memory controller;
receive the result of comparing the resulting data value with the test data value from the memory controller;
determine updated training-mode timing settings based on the result of comparing the resulting data value with the test data value; and
provide the updated training-mode timing settings to the PHY.

7. The apparatus of claim 6, wherein the PHY is configured to, during the write signal timing training:
skew timing of each of the plurality of SDRAM data bit signals relative to the SDRAM write clock signal at the PHY, the timing of each SDRAM data bit signal skewed an amount less than a data eye period, the timing of each SDRAM data bit signal skewed by a different amount; and
write the test data value represented by the plurality of data bit signals having the skewed timing to the SDRAM using the MPC FIFO write.

8. The apparatus of claim 7, wherein the processor system is configured to:
produce each of the plurality of test result samples by comparing a bit pattern of the resulting data value with a bit pattern of the test data value to determine bit differences indicating one of early arrival of the SDRAM data bit signals at the SDRAM from the PHY relative to the SDRAM write clock signal and late arrival of the data bit signals at the SDRAM from the PHY relative to the SDRAM write clock signal; and
determine updated training-mode timing settings by updating timing of the plurality of SDRAM data bit signals in a first direction relative to the SDRAM write clock signal by an amount less than the data eye period if the bit difference indicates early arrival of the data bit signals and updating the timing of the plurality of SDRAM data bit signals in a second direction relative to the SDRAM write clock signal by the amount less than the data eye period if the bit difference indicates late arrival of the SDRAM data bit signals.

9. The apparatus of claim 6, wherein the processor system is configured to:
produce each of the plurality of test result samples by comparing the resulting data value with the test data value to determine whether the resulting data value matches the test data value; and
determine updated training-mode timing settings by updating timing of the plurality of SDRAM data bit signals in a first direction by an amount less than a data eye period if the resulting data value matches the test data value and updating the timing of the plurality of SDRAM data bit signals a second direction by the amount less than the data eye period if the resulting data value does not match the test data value.

10. The apparatus of claim 1, further comprising one of a computing system, a mobile computing system, an Internet of Things (IoT) device, a virtual reality system, or an augmented reality system incorporating the host, the memory, and the link, wherein the processor system is configured to perform a computing function of the one of the computing system, the mobile computing system, the Internet of Things device, the virtual reality system, or the augmented reality system.

11. An apparatus for compensating for signal timing drift in a synchronous dynamic random access memory (SDRAM) system, comprising:
a host coupled to an SDRAM via a link, the host comprising a processor system, the host configured to:
control write signal timing training performed a plurality of times at periodic intervals interspersed with mission-mode SDRAM traffic, the write signal timing training using a multi-purpose command (MPC) first-in-first-out (FIFO) write and MPC FIFO read, the write signal timing training performed a plurality of times producing a corresponding plurality of test result samples;
analyze the plurality of test result samples independently of mission-mode SDRAM traffic; and
adjust mission-mode timing of a plurality of SDRAM data bit signals relative to an SDRAM write clock signal based on an analysis of the plurality of test result samples.

12. The apparatus of claim 11, wherein the host is configured to request interruption of mission-mode SDRAM traffic operation while the mission-mode timing is being adjusted.

13. The apparatus of claim 11, wherein the host is configured to control at each periodic interval:
  writing a test data value represented by the plurality of SDRAM data bit signals using the MPC FIFO write, wherein training-mode timing settings control timing of the plurality of SDRAM data bit signals relative to the SDRAM write clock signal during the MPC FIFO write;
  after writing the test data value, reading a resulting data value represented by the plurality of SDRAM data bit signals using the MPC FIFO read;
  comparing the resulting data value with the test data value independently of mission-mode SDRAM traffic;
  updating the training-mode timing settings independently of mission-mode SDRAM traffic based on comparing the resulting data value with the test data value.

14. The apparatus of claim 13, wherein the host is configured to:
  skew timing of each of the plurality of SDRAM data bit signals relative to the SDRAM write clock signal at a physical interface (PHY) coupled to the SDRAM, the timing of each SDRAM data bit signal skewed an amount less than a data eye period, the timing of each SDRAM data bit signal skewed by a different amount; and
  write the test data value represented by the plurality of data bit signals having the skewed timing to the SDRAM using the MPC FIFO write.

15. The apparatus of claim 14, wherein the host is configured to:
  produce each of the plurality of test result samples by comparing a bit pattern of the resulting data value with a bit pattern of the test data value to determine bit differences indicating one of early arrival of the SDRAM data bit signals at the SDRAM from the physical interface relative to the SDRAM write clock signal and late arrival of the data bit signals at the SDRAM from the physical interface relative to the SDRAM write clock signal; and
  update the training-mode timing settings by updating timing of the plurality of SDRAM data bit signals in a first direction relative to the SDRAM write clock signal by an amount less than the data eye period if the bit difference indicates early arrival of the data bit signals and updating the timing of the plurality of SDRAM data bit signals in a second direction relative to the SDRAM write clock signal by the amount less than the data eye period if the bit difference indicates late arrival of the SDRAM data bit signals.

16. The apparatus of claim 13, wherein the host is configured to:
  produce each of the plurality of test result samples by comparing the resulting data value with the test data value to determine whether the resulting data value matches the test data value; and
  update the training-mode timing settings by updating timing of the plurality of SDRAM data bit signals in a first direction by an amount less than a data eye period if the resulting data value matches the test data value, and updating the timing of the plurality of SDRAM data bit signals a second direction by the amount less than the data eye period if the resulting data value does not match the test data value.

17. The apparatus of claim 13, wherein the host is configured to:
  control performing the write signal timing training a plurality (M) of times to obtain M test result samples;
  each time the write signal timing training is performed, writing the test data value is performed a plurality (N) of times to N FIFO register locations, and reading the resulting data value is performed N times from the N FIFO register locations to obtain N results; and
  the N results are averaged to produce one of the M test result samples.

18. The apparatus of claim 11, further comprising one of a computing system, a mobile computing system, an Internet of Things (IoT) device, a virtual reality system, or an augmented reality system incorporating the host, the memory, and the link, wherein the processor system is configured to perform a computing function of the one of the computing system, the mobile computing system, the Internet of Things device, the virtual reality system, or the augmented reality system.

19. An apparatus for compensating for signal timing drift in a synchronous dynamic random access memory (SDRAM) system, comprising:
  means for performing write signal timing training a plurality of times at periodic intervals interspersed with mission-mode SDRAM traffic, the write signal timing training using a multi-purpose command (MPC) first-in-first-out (FIFO) write and MPC FIFO read, the write signal timing training performed a plurality of times producing a corresponding plurality of test result samples;
  means for analyzing the plurality of test result samples independently of mission-mode SDRAM traffic; and
  means for adjusting mission-mode timing of a plurality of SDRAM data bit signals relative to an SDRAM write clock signal based on an analysis of the plurality of test result samples.

20. The apparatus of claim 19, wherein the means for performing the write signal timing training a plurality of times at periodic intervals comprises:
  means for, at each periodic interval, writing a test data value represented by the plurality of SDRAM data bit signals using the MPC FIFO write, wherein training-mode timing settings control timing of the plurality of SDRAM data bit signals relative to the SDRAM write clock signal during the MPC FIFO write;
  means for, after writing the test data value, reading a resulting data value represented by the plurality of SDRAM data bit signals using the MPC FIFO read;
  means for comparing the resulting data value with the test data value independently of mission-mode SDRAM traffic;
  means for updating the training-mode timing settings independently of mission-mode SDRAM traffic based on comparing the resulting data value with the test data value.

21. The apparatus of claim 20, wherein:
  the means for writing the test data value represented by the plurality of SDRAM data bit signals using the MPC FIFO write comprises:
    means for skewing timing of each of the plurality of SDRAM data bit signals relative to the SDRAM write clock signal at a physical interface (PHY) coupled to the SDRAM, the timing of each SDRAM data bit signal skewed an amount less than a data eye period, the timing of each SDRAM data bit signal skewed by a different amount; and
    means for writing the test data value represented by the plurality of data bit signals having the skewed timing to the SDRAM using the MPC FIFO write;

reading the resulting data value comprises reading a resulting bit pattern;
the means for performing the write signal timing training produces each of the plurality of test result samples by comparing a bit pattern of the resulting data value with a bit pattern of the test data value to determine bit differences indicating one of early arrival of the SDRAM data bit signals at the SDRAM from the physical interface relative to the SDRAM write clock signal and late arrival of the data bit signals at the SDRAM from the physical interface relative to the SDRAM write clock signal; and
the means for updating the training-mode timing settings comprises means for updating timing of the plurality of SDRAM data bit signals in a first direction relative to the SDRAM write clock signal by an amount less than the data eye period if the bit difference indicates early arrival of the data bit signals and updating the timing of the plurality of SDRAM data bit signals in a second direction relative to the SDRAM write clock signal by the amount less than the data eye period if the bit difference indicates late arrival of the SDRAM data bit signals.

22. The apparatus of claim 20, wherein:
the means for performing the write signal timing training produces each of the plurality of test result samples by comparing the resulting data value with the test data value to determine whether the resulting data value matches the test data value; and
the means for updating the training-mode timing settings comprises means for updating timing of the plurality of SDRAM data bit signals in a first direction by an amount less than a data eye period if the resulting data value matches the test data value, and updating the timing of the plurality of SDRAM data bit signals a second direction by the amount less than the data eye period if the resulting data value does not match the test data value.

23. The apparatus of claim 20, wherein:
the means for performing write signal timing training performs the write signal timing training a plurality (M) of times to obtain M test result samples;
each time the write signal timing training is performed the means for writing the test data value writes the test data value a plurality (N) of times to N FIFO register locations, the means for reading the resulting data value reads the N FIFO register locations, and the means for comparing produces N results; and
the apparatus further comprises means for averaging the N results to produce one of the M test result samples.

24. The apparatus of claim 19, further comprising one of a computing system, a mobile computing system, an Internet of Things (IoT) device, a virtual reality system, or an augmented reality system incorporating the host, the memory, and the link, wherein the processor system is configured to perform a computing function of the one of the computing system, the mobile computing system, the Internet of Things device, the virtual reality system, or the augmented reality system.

25. A method for compensating for signal timing drift in a synchronous dynamic random access memory (SDRAM) system, comprising:
performing write signal timing training a plurality of times at periodic intervals interspersed with mission-mode SDRAM traffic, the write signal timing training using a multi-purpose command (MPC) first-in-first-out (FIFO) write and MPC FIFO read, the write signal timing training performed a plurality of times producing a corresponding plurality of test result samples;
analyzing the plurality of test result samples independently of mission-mode SDRAM traffic; and
adjusting mission-mode timing of a plurality of SDRAM data bit signals relative to an SDRAM write clock signal based on an analysis of the plurality of test result samples.

26. The method of claim 25, wherein performing the write signal timing training comprises:
writing a test data value represented by the plurality of SDRAM data bit signals using the MPC FIFO write, wherein training-mode timing settings control timing of the plurality of SDRAM data bit signals relative to the SDRAM write clock signal during the MPC FIFO write;
after writing the test data value, reading a resulting data value represented by the plurality of SDRAM data bit signals using the MPC FIFO read;
comparing the resulting data value with the test data value independently of mission-mode SDRAM traffic; and
updating the training-mode timing settings independently of mission-mode SDRAM traffic based on comparing the resulting data value with the test data value.

27. The method of claim 26, wherein adjusting the mission-mode timing comprises adjusting mission-mode timing settings controlling timing of the plurality of SDRAM data bit signals relative to the SDRAM write clock signal during the mission-mode SDRAM traffic, wherein the mission-mode SDRAM traffic is stalled only during the MPC FIFO write and MPC FIFO read and while the mission-mode timing settings are being adjusted.

28. The method of claim 27, wherein:
writing the test data value represented by the plurality of SDRAM data bit signals using the MPC FIFO write comprises:
skewing timing of each of the plurality of SDRAM data bit signals relative to the SDRAM write clock signal at a physical interface (PHY) coupled to the SDRAM, the timing of each SDRAM data bit signal skewed an amount less than a data eye period, the timing of each SDRAM data bit signal skewed by a different amount; and
writing the test data value represented by the plurality of data bit signals having the skewed timing to the SDRAM using the MPC FIFO write;
reading the resulting data value comprises reading a resulting bit pattern;
performing the write signal timing training produces each of the plurality of test result samples by comparing a bit pattern of the resulting data value with a bit pattern of the test data value to determine bit differences indicating one of early arrival of the SDRAM data bit signals at the SDRAM from the physical interface relative to the SDRAM write clock signal and late arrival of the data bit signals at the SDRAM from the physical interface relative to the SDRAM write clock signal; and
updating the training-mode timing settings comprises updating timing of the plurality of SDRAM data bit signals in a first direction relative to the SDRAM write clock signal by an amount less than the data eye period if the bit difference indicates early arrival of the data bit signals and updating the timing of the plurality of SDRAM data bit signals in a second direction relative to the SDRAM write clock signal by the amount less than the data eye period if the bit difference indicates late arrival of the SDRAM data bit signals.

29. The method of claim 27, wherein:
the write signal timing training produces each of the plurality of test result samples by comparing the resulting data value with the test data value and determining whether the resulting data value matches the test data value; and
updating the training-mode timing settings comprises updating timing of the plurality of SDRAM data bit signals in a first direction by an amount less than a data eye period if the resulting data value matches the test data value, and adjusting the timing of the plurality of SDRAM data bit signals a second direction by the amount less than the data eye period if the resulting data value does not match the test data value.

30. The method of claim 27, wherein:
the write signal timing training is performed a plurality (M) of times to obtain M test result samples;
each time the write signal timing training is performed, writing the test data value is performed a plurality (N) of times to N FIFO register locations, reading the resulting data value is performed N times from the N FIFO register locations, and the comparing is performed N times to produce N results; and
the method further comprises averaging the N results are averaged to produce one of the M test result samples.

* * * * *